United States Patent

Khosropour et al.

[11] Patent Number: 6,159,755
[45] Date of Patent: Dec. 12, 2000

[54] METHOD AND SYSTEM FOR DETECTING FAULTS IN A FLIP-CHIP PACKAGE

[75] Inventors: Fred Khosropour, San Jose; Mehdad Mahanpour, Union City; Ahmad Ghaemmaghami, Morgan Hill, all of Calif.

[73] Assignee: Advanced Micro Devices, Inc., Sunnyvale, Calif.

[21] Appl. No.: 09/111,557

[22] Filed: Jul. 8, 1998

[51] Int. Cl.[7] .................................................. H01L 21/66
[52] U.S. Cl. ............................................. 438/14; 438/14
[58] Field of Search .................................. 438/7, 14, 16, 438/17; 427/10; 324/765, 551; 257/48

[56] References Cited

U.S. PATENT DOCUMENTS

| | | | |
|---|---|---|---|
| 3,665,307 | 5/1972 | Cocca | 324/158.1 |
| 3,934,199 | 1/1976 | Channin | 324/158.1 |
| 4,514,436 | 4/1985 | Moerschel | 427/10 |
| 5,394,101 | 2/1995 | Mitros | 324/769 |
| 5,422,498 | 6/1995 | Nikawa et al. | 257/48 |
| 5,757,193 | 5/1998 | Yu et al. | 324/501 |
| 5,913,103 | 6/1999 | Chen | 438/14 |
| 5,963,040 | 10/1999 | Liu | 324/551 |

OTHER PUBLICATIONS

Dictionary: fats and oils; Epicurious Dictionary; from epicurious.com.
Peanut Oil Experiment; Experient: Solubility and the Percent of Oil in Peanuts, from woodrow.org.
MSDS Direct Drive Oil; HYVAC Products, Inc; Material Safety data Sheet; from hyvac.com.
Peanut oil 5% in aqueous cream; Material Safety Data Sheet; Orion Laboratories Pty Ltd; from orion.net.
Dictionary; peanut oil; Epicurious Dictionary; from epicorious.com Re: Peanut vs. Peanut Oil for Type A's; http://www.dadamo.com/forum/board2/messages/651.html.

*Primary Examiner*—David Nelms
*Assistant Examiner*—David Nhu
*Attorney, Agent, or Firm*—Sawyer Law Group LLP

[57] ABSTRACT

A system and method for detecting at least one fault in at least one circuit of a flip-chip package is disclosed. The circuit located on a first portion of a semiconductor die. The method and system include the steps of thinning the semiconductor die without destroying the at least one circuit. The method and system further include applying a liquid having a high evaporation rate in a layer on at least a portion of an exposed surface of the semiconductor die after thinning and applying power to the at least one circuit. The method and system also include determining where at least one portion of the liquid has evaporated from the exposed surface of the semiconductor die to detect the at least one fault.

15 Claims, 4 Drawing Sheets

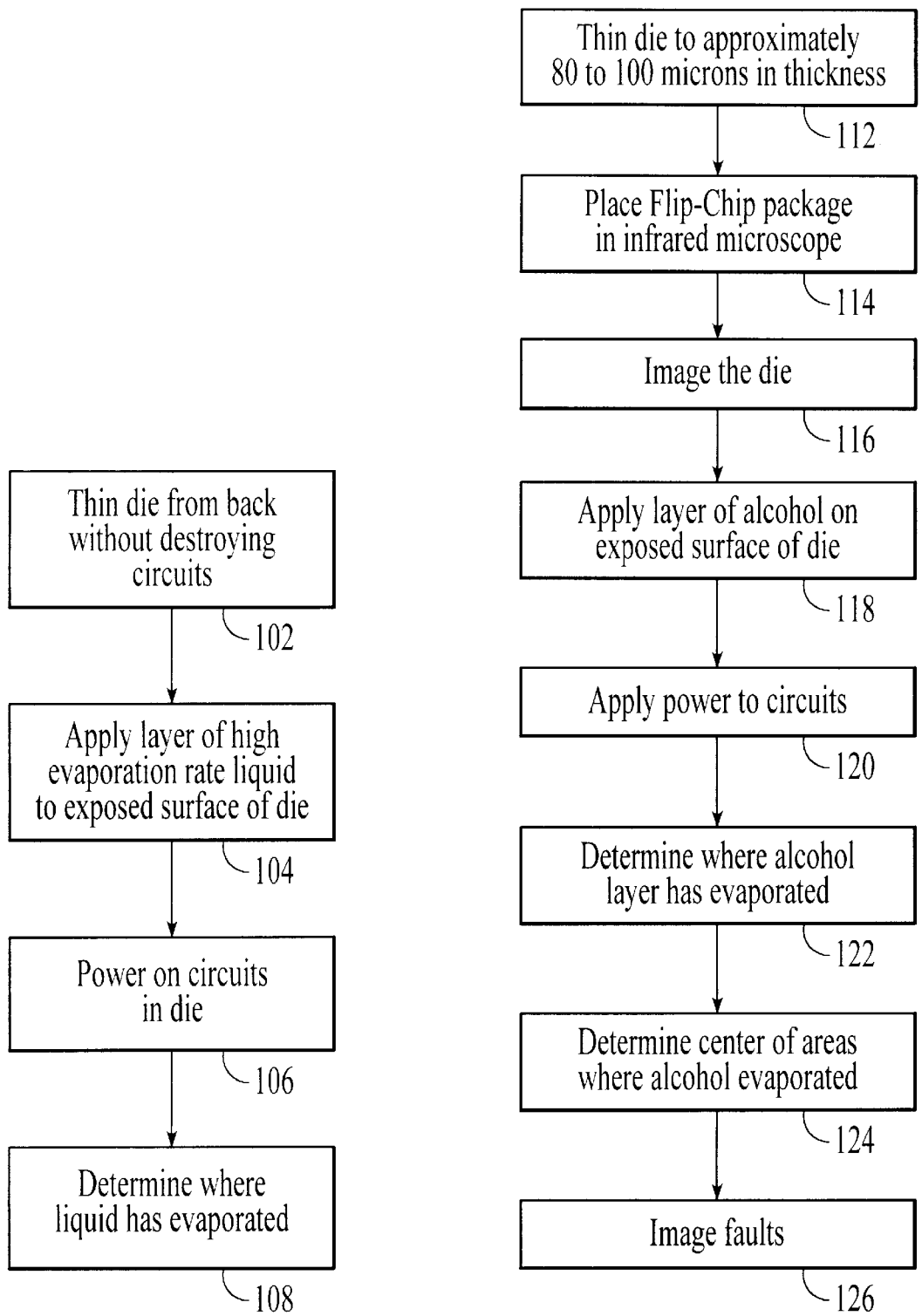

METHOD AND SYSTEM FOR DETECTING FAULTS IN A FLIP-CHIP PACKAGE

FIELD OF THE INVENTION

The present invention relates to detection of faults and more particularly to a method and system for allowing detection of faults in a flip-chip package without destroying the circuitry on a semiconductor die in the flip-chip package.

BACKGROUND OF THE INVENTION

After fabrication of circuits on a semiconductor die, detection of faults is often desirable. Detecting these faults without destroying the circuitry on the semiconductor is also useful. Because the circuit was preserved during fault detection, the circuit can also undergo other testing prior to deprocessing. Once the position of the fault is detected and other testing completed, the circuit may be deprocessed in order to determine the exact nature of the fault or to further investigate the properties of the circuit.

Conventional semiconductor dies are mounted on a substrate with the circuitry at the top and the bottom of the die in contact with the substrate. This combination is known as a conventional package. Leads typically connect portions of the circuit at the top of the die to the substrate. In order to detect faults which cause hot spots on such a circuit, a liquid crystal is conventionally used. A thin layer of liquid crystal is poured over the circuits at the top of the die. When power is connected to the circuits, the liquid crystal changes phase over any hot spots in the circuits. Consequently, the liquid crystal changes color over these hot spots in the circuit. These hot spots and, therefore, areas where the liquid crystal has changed color mark the position of certain faults in the circuits. Consequently, the position of faults in the circuit can be detected.

Although conventional liquid crystal detection functions for circuits in conventional packages, this method does not function for some newer semiconductor circuit packages. Circuits for some high speed applications, such as certain microprocessors, cannot function adequately if mounted in a conventional manner. In order to make electrical connection between the circuit on the semiconductor die and the substrate, therefore, the semiconductor die is flipped. Thus, the top of the die, where the circuits are formed, is in contact with the substrate. Separate leads are not used. The combination of substrate and the die having it top in contact with the substrate is known as a flip-chip package.

It is still desirable to detect faults in the circuits of a flip-chip package. However, because the die is flipped, the circuits are not readily accessible. In addition, the portion of the semiconductor die below the circuits is significantly thicker than the portion of the semiconductor die in which the circuits are formed. Consequently, applying the liquid crystal to the back of the die which is readily accessible will not detect faults causing hot spots within the circuits in the flip-chip package.

Accordingly, what is needed is a system and method for detecting faults in circuits on flip-chip packages without destroying the circuits. The present invention addresses such a need.

SUMMARY OF THE INVENTION

The present invention provides a method and system for detecting at least one fault in at least one circuit of a flip-chip package. The circuit located on a first portion of a semiconductor die. The method and system comprise the steps of thinning the semiconductor die without destroying the at least one circuit. The method and system further comprise applying a liquid having a high evaporation rate in a layer on at least a portion of an exposed surface of the semiconductor die after thinning and applying power to the it least one circuit. The method and system also comprise determining where at least one portion of the liquid has evaporated from the exposed surface of the semiconductor die to detect the at least one fault.

According to the system and method disclosed herein, the present invention allows detection of certain faults in a circuit on a semiconductor die without destroying the circuit, thereby increasing overall system performance.

BRIEF DESCRIPTION OF THE DRAWINGS

FIG. 5 is a high level flow chart a method for detecting certain faults without destroying the circuit.

FIG. 6 depicts a more detailed flow chart of a method for detecting certain faults without destroying the circuit.

DETAILED DESCRIPTION OF THE INVENTION

The present invention relates to an improvement in detecting faults in semiconductor circuits. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
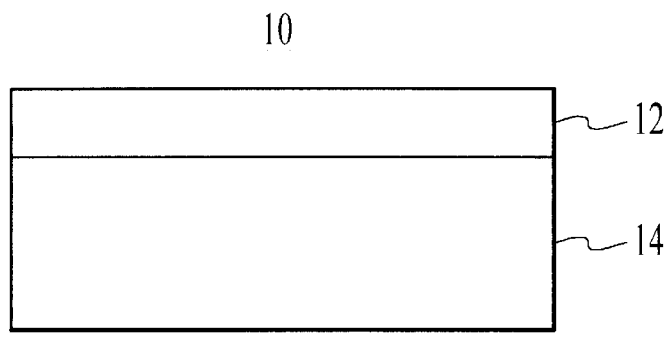
FIG. 1 is a block diagram of a semiconductor die including circuitry.

FIG. 1 is a block diagram of a conventional semiconductor die 10. Typically, the semiconductor used is silicon. The die 10 includes a first portion 12 in which circuits (not shown) are formed. The surface of the first portion 12 is typically considered the top of the die 10. The die 10 also includes a second portion 14 under the first portion 12. The second portion 14 is significantly thicker than the first portion 12 in which the circuits are formed. Typically, the first portion 12 is between approximately eighty and one hundred microns thick. The second portion 14 is typically several hundred microns thick.

Figure 2:
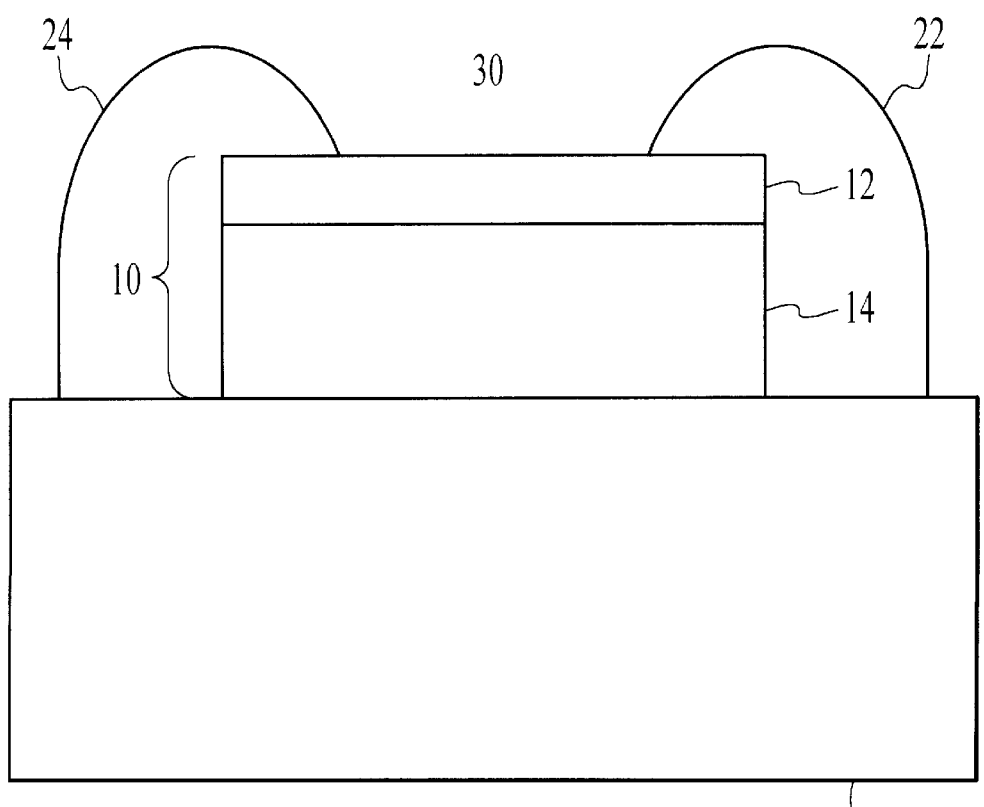
FIG. 2 is a block diagram depicting the semiconductor die mounted in a conventional package.

FIG. 2 depicts a conventional chip package 30. The conventional package 30 includes a die 10 mounted on a substrate 20. The die 10 is mounted so that the first portion 12 of the die 30 is face up, away from the substrate 20. The bottom of the second portion 14 of the die 30 contacts the substrate 20. Leads 22 and 24 electrically connected the circuits in the first portion of the die 10 to the wiring in the substrate 20.

It is often desirable to examine the conventional package 30 for faults such as junction shorts, metal shorts, or junction breakdowns in the circuits on the die 10. Typically these faults generate heat during operation of the circuits on the die 10. These faults should be detected without destroying the circuits. In addition to detecting the existence of such faults within the circuits, the location of the faults should be determined.

Figure 3:
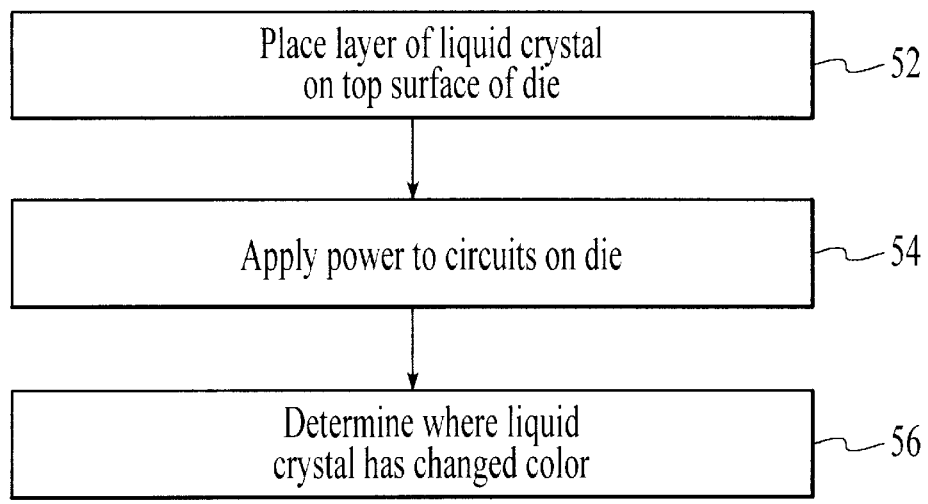
FIG. 3 is a flow chart of a conventional method for detecting certain faults in a conventional package.

FIG. 3 is a flow chart depicting a conventional method 50 for detecting faults in circuits in the package 30. A layer of a liquid crystal (not shown) is placed on the top surface of the die 10 via step 52. Thus, the liquid crystal is placed on the surface of the first portion 12 of the die 10 in step 52. The liquid crystal is in proximity to the circuits in the first portion 12 of the die 10. Power is then applied to the circuits in the first portion of the die 10, via step 54. Faults such as shorts or a junction breakdown will generate heat when power is applied to them. As a result, the liquid crystal undergoes a phase transition over a portion of the circuit in which the fault exists. The phase transition causes the liquid crystal over the portion of the circuit in which the fault exists to change color. Thus, it is determined via step 56 where the liquid crystal has changed color. By determining where the liquid crystal has changed color, the existence and location of faults can be determined.

Figure 4:
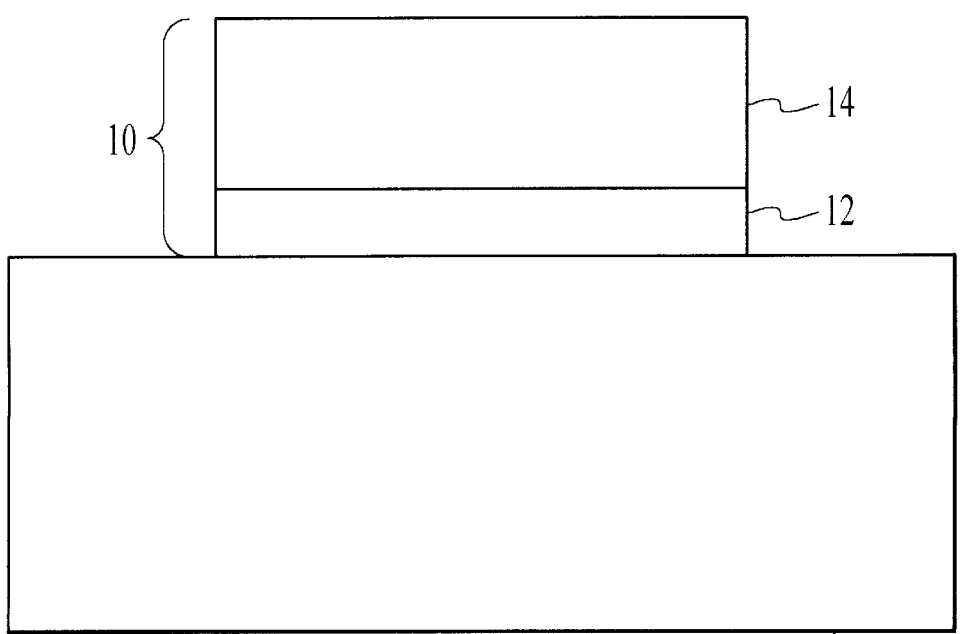
FIG. 4 is a block diagram of a flip-chip package.

Although the method 50 can detect faults in conventional packages, those with ordinary skill in the art will realize that the method 50 cannot detect faults in newer flip-chip packages. FIG. 4 depicts a flip-chip package 60. In the flip-chip package, the die 10 is mounted with the first portion 12 face down, in close proximity to the substrate 20. Flip-chip packages are increasingly used for high speed applications, such as certain microprocessors. Electrical contact to circuits in the first portion 12 of the die 10 is made through the substrate 20. Thus, external leads to the circuits are typically not used.

Because the first portion 12 of the die 10 is not exposed in the flip-chip package 60, one of ordinary skill in the art will readily recognize that the method 50 shown in FIG. 3 will not detect faults. Referring back to FIG. 4, if a layer of liquid crystal is placed on the top surface of the die 10, the liquid crystal will be on the second portion 14 of the die 10. As a result, the liquid crystal is not in proximity to the circuits and does not change color in areas where faults in the circuit exist. It is hypothesized that this is because the faults do not generate sufficient heat to raise the temperature of the second portion 14 of the die 10 enough to change the color of the liquid crystal only over areas near the faults. Instead, the heat generated merely warms the second portion 14 of the die. Thus, the method 50 cannot detect faults in a flip-chip package.

The present invention provides for a method and system for detecting heat-generating fault, in circuits in a flip-chip package. The present invention will be described in terms of a particular number and type of faults. However, one of ordinary skill in the art will readily recognize that this method and system will operate effectively for other types and other numbers of faults which generate heat. In addition, the method will be described in terms of a particular liquid and imaging system used in detecting faults. One of ordinary skill in the art will, however, readily recognize that the method and system function effectively for other materials having adequate properties and other imaging systems.

The present invention provides a method and system for detecting at least one fault in at least one circuit of a flip-chip package. The circuit located on a first portion of a semiconductor die. The method and system comprise the steps of thinning the semiconductor die without destroying the at least one circuit. The method and system further comprise applying a liquid having a high evaporation rate in a layer on at least a portion of an exposed surface of the semiconductor die after thinning and applying power to the at least one circuit. Preferably, the liquid is isopropyl alcohol. The method and system also comprise determining where at least one portion of the liquid has evaporated from the exposed surface of the semiconductor die to detect the at least one fault.

To more particularly illustrate the method and system in accordance with the present invention, refer now to FIG. 5 depicting a high level flow chart of one embodiment of a method 100 for detecting faults in accordance with the present invention. The die 10 is thinned from the back, from the accessible surface of the second portion 14, via step 102. Note that the accessible surface is the back of the die 10 rather than the top of the first portion 12 of the die as in the conventional package 10. The die 10 is thinned without damaging the circuits in the first portion 12 of the die 10. Consequently, in a preferred embodiment, the second portion 14 of the die 10 is thinned until just before the first portion 12 of the die is exposed. A liquid having a high evaporation rate is then applied to the surface of the die 10, via step 104. Preferably, the liquid used is isopropyl alcohol. Power is then applied to the circuits in the die 10 via step 106. Areas where the alcohol has evaporated are then detected, via step 108. Areas where the alcohol has evaporated, at least partly exposing the portion of the die 10, indicate the existence and location of faults in the circuit which generate heat.

Isopropyl alcohol has a high evaporation rate. In addition, the evaporation rate is not so high that the alcohol evaporates over areas of the die 10 where faults do not exist when power is applied to the circuit in the die 10. Other suitable liquids having high evaporations rates include but are not limited to acetone and gasoline. However, isopropyl alcohol is preferred over acetone and gasoline. Acetone and gasoline have a relatively low flashpoint. The flashpoint of a liquid is the point at which the vapor pressure of the liquid is sufficiently high to be explosively ignited by a spark. The flashpoints of acetone and gasoline are both at approximately negative eighteen degrees Celsius. The flashpoint of isopropyl alcohol is at approximately seventeen degrees Celsius. Thus, isopropyl alcohol is less likely to explode. Moreover, gasoline contains benzene, a carcinogen. Thus, isopropyl alcohol is safer to use than acetone or gasoline. The evaporation rates of acetone and gasoline, however, make them capable of being used in conjunction with the present invention. Note, however, that the conventional liquid crystal is generally not appropriate for use with the present invention. This is because the liquid crystal may not change phase over the faults when power is applied to circuits in the die 10 even when the die 10 has been thinned.

FIG. 6 depicts a more detailed flow chart of a method 110 for detecting faults in circuits of the semiconductor die 10 in the flip-chip package 60. The second portion 14 of the die 10 is thinned until the remainder of the die 10 is approximately eighty to one hundred microns thick, via step 112. Since the first portion 12 of the die 10 is typically on the order of eighty to one hundred microns thick, thinning the die as in step 112 should ensure that the circuits in the first portion 12 of the die 10 are not damaged. The flip-chip package 60 is then placed in a microscope (not shown) via step 114. Preferably, the microscope is an infrared microscope which uses an infrared laser (not shown) as a light source. The microscope is then focused to provide an image of the die 10, via step 116. A thin layer of alcohol is then applied to the exposed surface of the die 10, via step 118. Preferably, the layer is thin enough to just cover the exposed surface of the die 10. Power is then applied to the circuits in the first portion 12 of the die 10, via step 120. Faults, such as junction or metal shorts, which generate heat may then cause a portion of the alcohol to evaporate. Thus, via step 122, the microscope is focused to image the hot spots, areas where a portion of the alcohol has evaporated. The center of the hot spot is then determined via step 124. As a result, these faults are detected. The infrared microscope can image either the exposed surface of the die 10 or areas of the die 10 below the exposed surface. Consequently, once the centers of the areas where a portion of the alcohol has evaporated are found and imaged, the faults lying substantially below the centers of these areas can be imaged, via step 126.

Figure 7A:
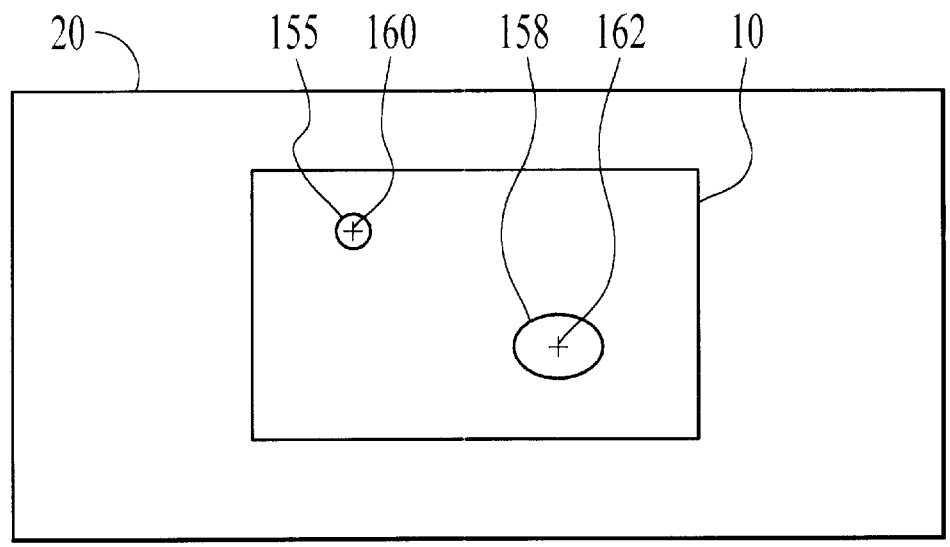
FIG. 7A is a block diagram of a plan view the flip-chip package during detection of faults in accordance with the present invention.
Figure 7B:
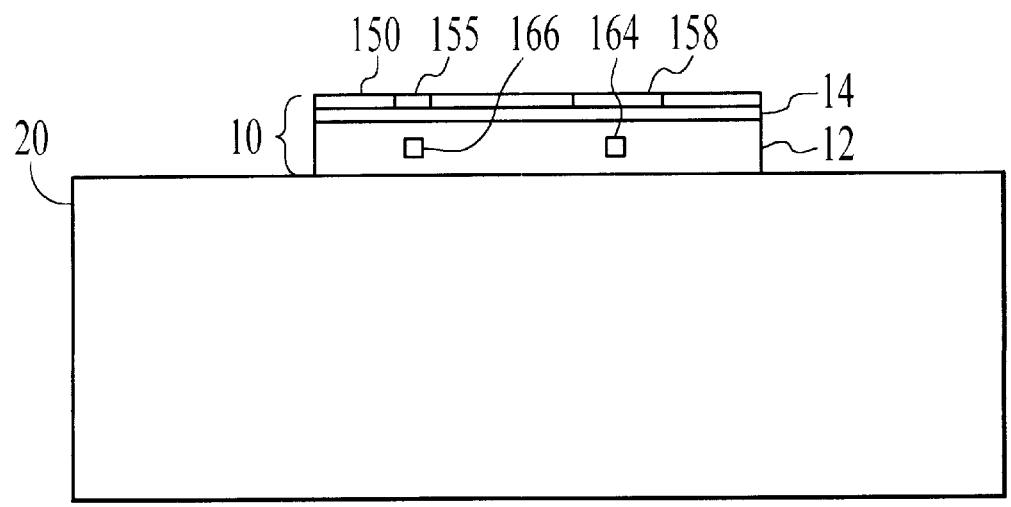
FIG. 7B is a block diagram of a side view of the flip-chip package during detection of faults in accordance with the present invention.

Refer now to FIGS. 7A and 7B which depict a plan view and a side view of the flip-chip package 60 during the method 110 or 100. The die 10 has a layer 150 of alcohol on its surface. A portion of the layer 150 of alcohol has evaporated over areas 155 and 158. The areas 155 and 158 are generally relatively circular in shape. In order to locate the position of the faults, the centers 160 and 162 of the circular areas 155 and 158 are determined. The faults 164 and 166 lie approximately below the centers of the areas 155 and 158. Consequently, the areas 155 and 158 are imaged in step 122 and the faults 164 and 166 imaged in step 126 of the method 110. In a preferred embodiment, even when imaging the faults 164 and 166 lying below the surface of the die 10, edges of the areas 155 and 158 are visible to the user, further facilitating detection of the faults.

A method and system has been disclosed for detecting faults in circuits in a semiconductor die of a flip-chip package. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for detecting at least one fault in at least one circuit of a flip-chip package, the circuit located on a first portion of a semiconductor die, the method comprising the steps of:
    (a) thinning the semiconductor die without destroying the at least one circuit;
    (b) applying a liquid having a high evaporation rate in a layer on at least a portion of an exposed surface of the semiconductor die after thinning;
    (c) applying power to the at least one circuit so that the at least one fault can generate heat; and
    (d) determining where at least one portion of the liquid has evaporated from the exposed surface of the semiconductor die due to the heat generated by the at least one fault to detect the at least one fault.

2. The method of claim 1 wherein the liquid is alcohol.

3. The method of claim 2 wherein the thinning step (a) further comprises the step of:
    (a1) removing a second portion of the semiconductor die, wherein at least eighty microns of the first portion of the semiconductor die remain.

4. The method of claim 3 wherein the at least one portion of the liquid which has evaporated further has a substantially circular shape and wherein the determining step (d) further comprises the step of:
    (d1) determining at least one central location of the center of the circular shape of the at least one portion of the liquid which has evaporated to determine the at least one location of the at least one fault.

5. The method of claim 4 wherein the determining step (d) further comprises the step of:
    (d2) imaging the at least one central location of the center of the circular shape of the at least one portion of the liquid which has evaporated.

6. The method of claim 5 further comprising the step of:
    (e) imaging the at least one circuit.

7. A system for detecting at least one fault in at least one circuit of a flip-chip package, the circuit located on a first portion of a semiconductor die, the system comprising:
    means for thinning the semiconductor die without destroying the at least one circuit;
    means for applying a liquid having a high evaporation rate in a layer on at least a portion of an exposed surface of the semiconductor die after thinning;
    means for applying power to the at least one circuit so that the at least one fault can generate heat; and
    wherein at least one area where at least one portion of the liquid has evaporated from the exposed surface of the semiconductor die due to the heat generated by the at least one fault, the at least one area determining at least one location of the at least one fault.

8. The system of claim 7 wherein the liquid is alcohol.

9. The system of claim 8 wherein the thinning means further comprise:
    means for removing a second portion of the semiconductor die, wherein at least eighty microns of the first portion of the semiconductor die remain.

10. The system of claim 9 wherein the at least one portion of the liquid which has evaporated further has a substantially circular shape and wherein
    at least one central location of the center of the circular shape of the at least one portion of the liquid which has evaporated determines the at least one location of the at least one fault.

11. The system of claim 10 wherein the determining means further comprise:
    means for imaging the at least one location of the center of the circular shape of the at least one portion of the liquid which has evaporated.

12. The system of claim 11 wherein the imaging means further image the at least one circuit.

13. The system of claim 12 wherein the imaging means further comprise:
    an infrared microscope.

14. The method of claim 1 wherein the high evaporation rate of the liquid is at least approximately the evaporation rate of alcohol.

15. The system of claim 7 wherein the high evaporation rate of the liquid is at least approximately the evaporation rate of alcohol.

* * * * *